(12) United States Patent
Harada

(10) Patent No.: US 7,934,136 B2
(45) Date of Patent: Apr. 26, 2011

(54) TEST APPARATUS, PATTERN GENERATOR, TEST METHOD AND PATTERN GENERATING METHOD

(75) Inventor: Eiji Harada, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 359 days.

(21) Appl. No.: 12/142,491

(22) Filed: Jun. 19, 2008

(65) Prior Publication Data

US 2008/0319700 A1    Dec. 25, 2008

(30) Foreign Application Priority Data

Jun. 22, 2007   (JP) ................. 2007-165574

(51) Int. Cl.
 *G01R 31/28*   (2006.01)
(52) U.S. Cl. ........ 714/738; 714/731; 714/715; 714/735; 714/742
(58) Field of Classification Search .................. 714/738, 714/731, 715, 735, 742
See application file for complete search history.

(56) References Cited

U.S. PATENT DOCUMENTS

| | | | | |
|---|---|---|---|---|
| 5,761,212 A * | 6/1998 | Foland et al. | ................ | 714/719 |
| 6,208,571 B1 * | 3/2001 | Ikeda et al. | ................... | 365/201 |
| 6,546,543 B1 * | 4/2003 | Manabe et al. | ................ | 716/21 |
| 6,650,583 B2 * | 11/2003 | Haraguchi et al. | ............ | 365/201 |
| 7,054,788 B2 * | 5/2006 | Akutsu | ........................ | 702/184 |
| 7,506,291 B2 * | 3/2009 | Tada et al. | ......................... | 716/6 |
| 2004/0246337 A1* | 12/2004 | Hasegawa et al. | ............ | 348/189 |
| 2006/0107134 A1* | 5/2006 | Park et al. | ..................... | 714/718 |

FOREIGN PATENT DOCUMENTS

JP    2004-150820 A    5/2004

* cited by examiner

*Primary Examiner* — John J Tabone, Jr.
(74) *Attorney, Agent, or Firm* — Sughrue Mion, PLLC

(57) ABSTRACT

Provided is a test apparatus for testing a specimen by using a test pattern and an expected value pattern. The test apparatus includes: a control unit for outputting a test pattern to the specimen; a pattern converting unit for converting the expected value pattern based on an output pattern output from the specimen upon an input of the test pattern; and a determination unit for determining the specimen as a non-defective product or a defective product by using the converted expected value pattern.

20 Claims, 10 Drawing Sheets

EXPECTED VALUE ERROR LIST

EXPECTED VALUE ERROR HISTOGRAM

| EXPECTED VALUE PATTERN | 0 1 0 1 1 1 1 0 |
|---|---|
| CONVERTED EXPECTED VALUE PATTERN | 0 1 0 1 1 1 1 1 |

Fig. 10

TEST APPARATUS, PATTERN GENERATOR, TEST METHOD AND PATTERN GENERATING METHOD

BACKGROUND OF THE INVENTION

1. Field of the Invention

The present invention relates to a test apparatus, a pattern generator, a test method, and a pattern generating method. In particular, the present invention relates to a test apparatus, a pattern generator, a test method, and a pattern generating method for carrying out a delay test of a semiconductor integrated circuit.

2. Description of Related Art

In recent years, development of semiconductor integrated circuit technologies has been remarkable. With such development, there is a demand for carrying out a test of a semiconductor integrated circuit with higher precision.

In a test process for a semiconductor integrated circuit, based on circuit information on a circuit under test (specimen), a test pattern and an expected value pattern, which are configured as a sequence of logical values (digital signal sequence), are prepared in advance. Then, a determination is made as to whether an output pattern output from a specimen based on a clock and an input of the test pattern matches the expected value pattern. When the output pattern matches the expected value pattern, the specimen is determined as a non-defective product, and when the output pattern does not match the expected value pattern, the specimen is determined as a defective product.

Japanese Unexamined Patent Application Publication No. 2004-150820 discloses a test vector generator for generating a test vector for specifying a specific region of a semiconductor integrated circuit, to thereby test the specific region.

As described above, the expected value pattern is obtained based on the circuit information on the circuit under test. In other words, the expected value pattern is determined without accurately considering a process error or the like to be generated during a manufacturing process. Accordingly, the expected value pattern may differ from the output pattern output from the specimen which is to be determined as a non-defective product. Further, there arises a problem in that the specimen to be determined as a non-defective product during the test process is erroneously determined as a defective product during the test process, with the result that the yield of semiconductor integrated circuits deteriorates. Such a problem becomes more serious in a case of testing the circuit under test by a clock having a frequency equal to or greater than a normal operating frequency of the circuit under test.

SUMMARY

In one embodiment of the present invention, there is provided a test apparatus testing a specimen by using a test pattern and an expected value pattern, the test apparatus including: a control unit outputting the test pattern to the specimen; a pattern converting unit converting the expected value pattern based on an output pattern output from the specimen upon an input of the test pattern; and a determination unit determining the specimen as one of a non-defective product and a defective product by using the converted expected value pattern.

In another embodiment of the present invention, there is provided a pattern generator generating a pattern for determination to be used for a delay test of a specimen, the pattern generator including: a control unit outputting a test pattern to the specimen; and a pattern converting unit converting an expected value pattern based on an output pattern output from the specimen upon an input of the test pattern, to output the converted expected value pattern.

In still another embodiment of the present invention, there is provided a test method of testing a specimen by using a test pattern and an expected value pattern, the test method including: inputting the test pattern to the specimen; converting the expected value based on an output pattern output from the specimen upon an input of the test pattern; and determining the specimen as one of a non-defective product and a defective product by using the converted expected value pattern.

In yet another embodiment of the present invention, there is provided a pattern generating method of generating a pattern for determination to be used for a delay test of a specimen, the pattern generation method including: inputting a test pattern to the specimen; and converting an expected value pattern based on an output pattern output from the specimen upon an input of the test pattern.

By converting the expected value pattern based on the output pattern, the output pattern output from the non-defective product is prevented from differing from the expected value pattern, with the result that the yield of the specimens is prevented from deteriorating.

The present invention is capable of preventing the deterioration in the yield of the specimens due to the difference between the output pattern output from the non-defective product and the expected value pattern.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 10 is a schematic diagram for explaining conversion of the expected value pattern according to the first embodiment of the present invention.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the present invention will be described with reference to the drawings. Note that the embodiments are simplified for ease of explanation. Since the drawings are briefly described, the technical scope of the present invention should not be limited on the basis of the description of the drawings. The same components are denoted by the same reference symbols, and redundant description thereof is omitted.

First Embodiment

Figure 1:
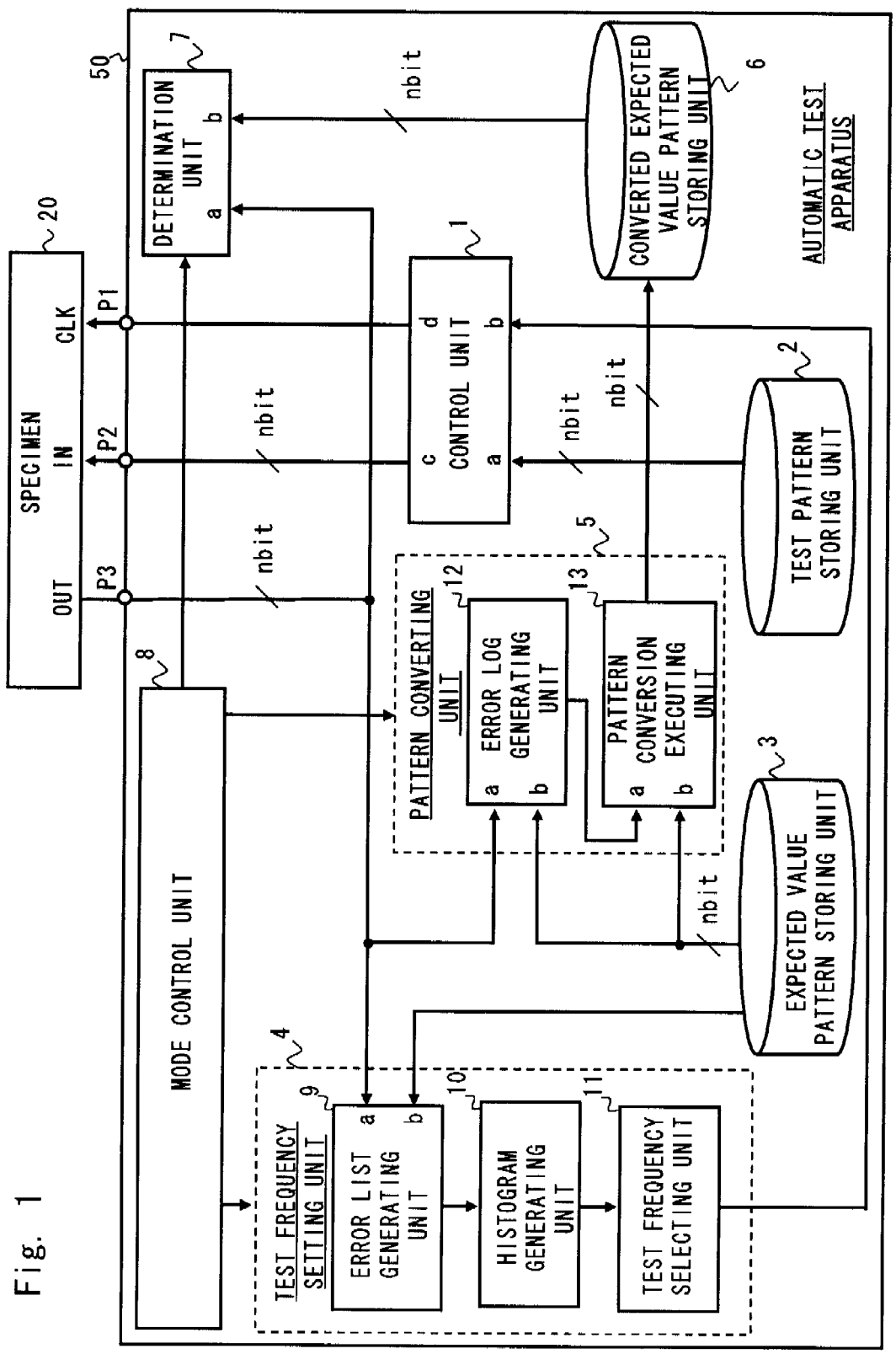
FIG. 1 is a schematic block diagram showing an automatic test apparatus according to a first embodiment of the present invention.
Figure 2:
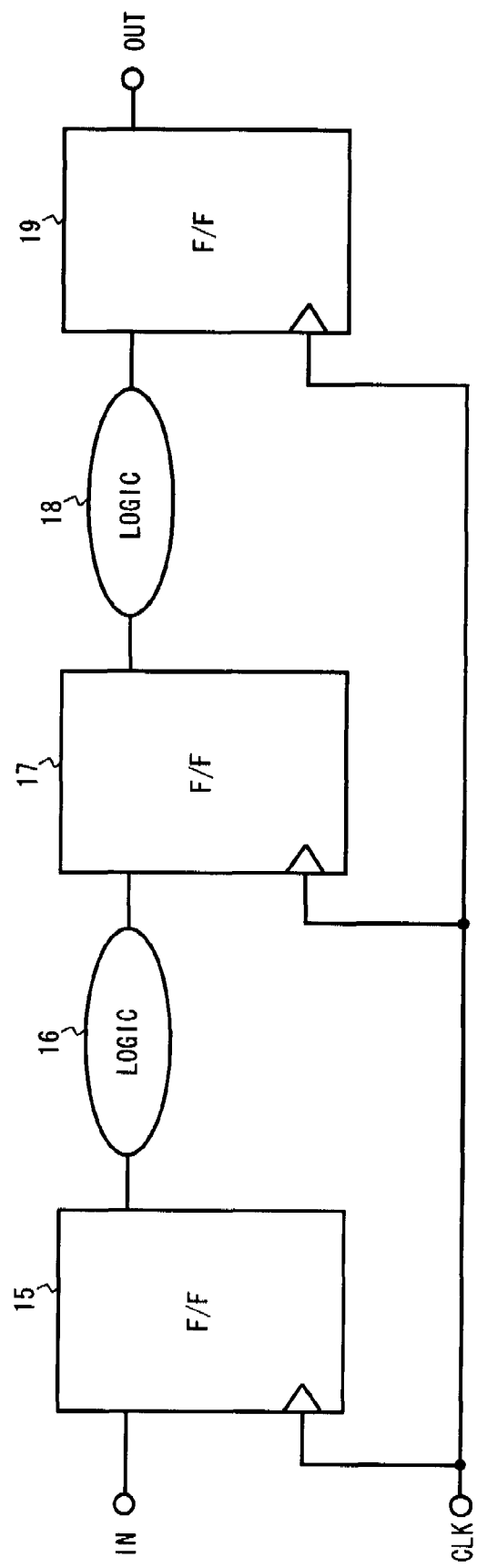
FIG. 2 is a diagram for explaining a delay test according to the first embodiment of the present invention.
Figure 3:
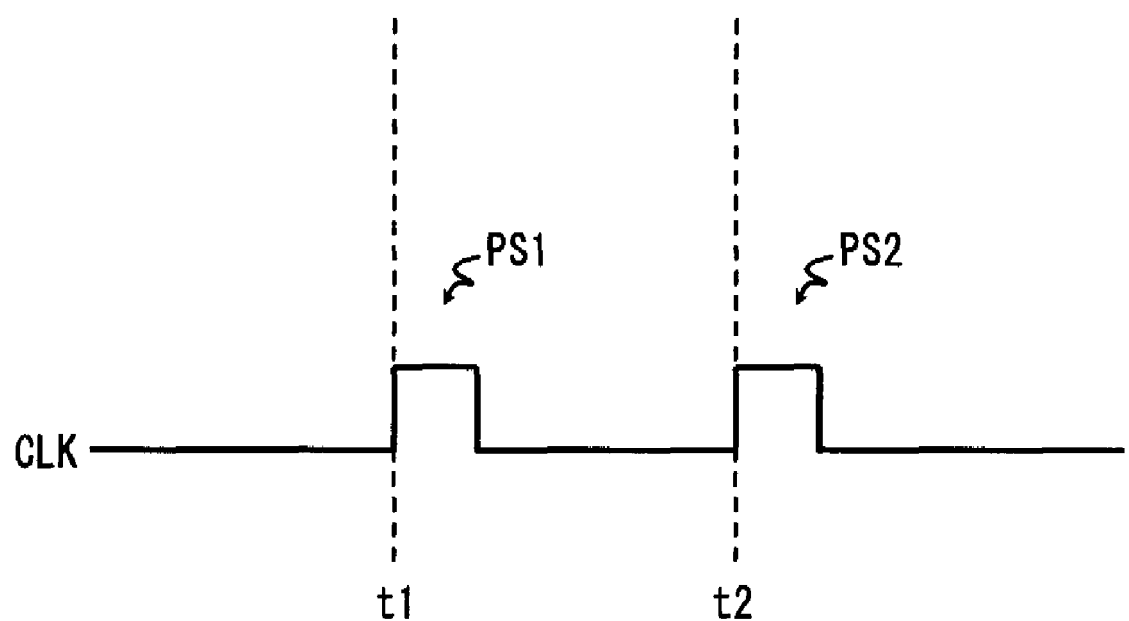
FIG. 3 is a diagram for explaining a clock signal for a delay test input to a specimen according to the first embodiment of the present invention.
Figure 4A:
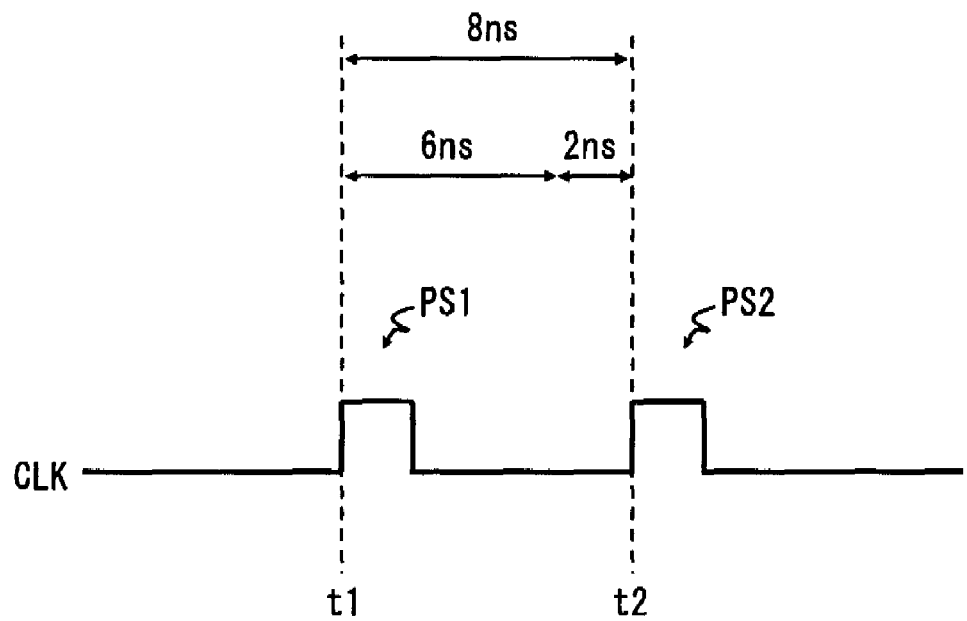
FIGS. 4A and 4B are diagrams for explaining a delay value according to the first embodiment of the present invention.
Figure 4B:
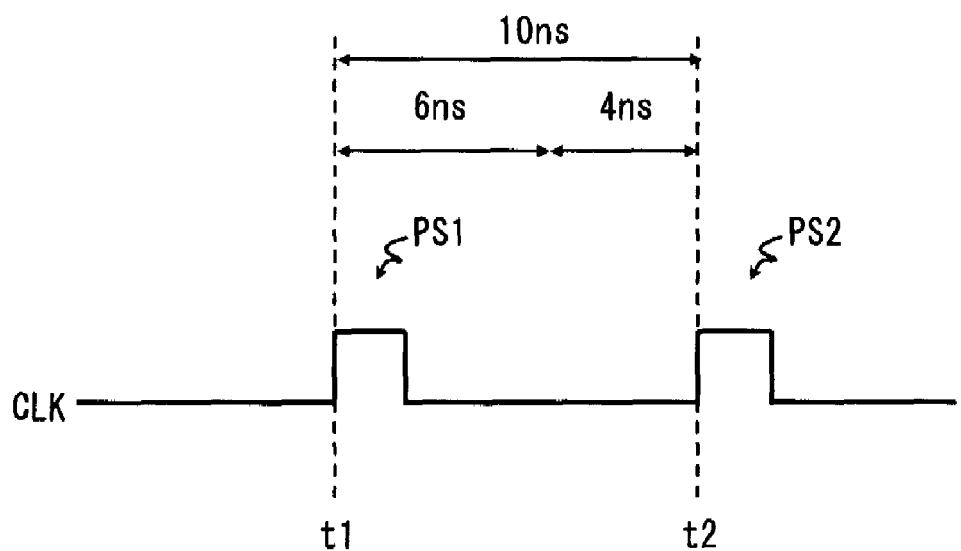
Figure 5:
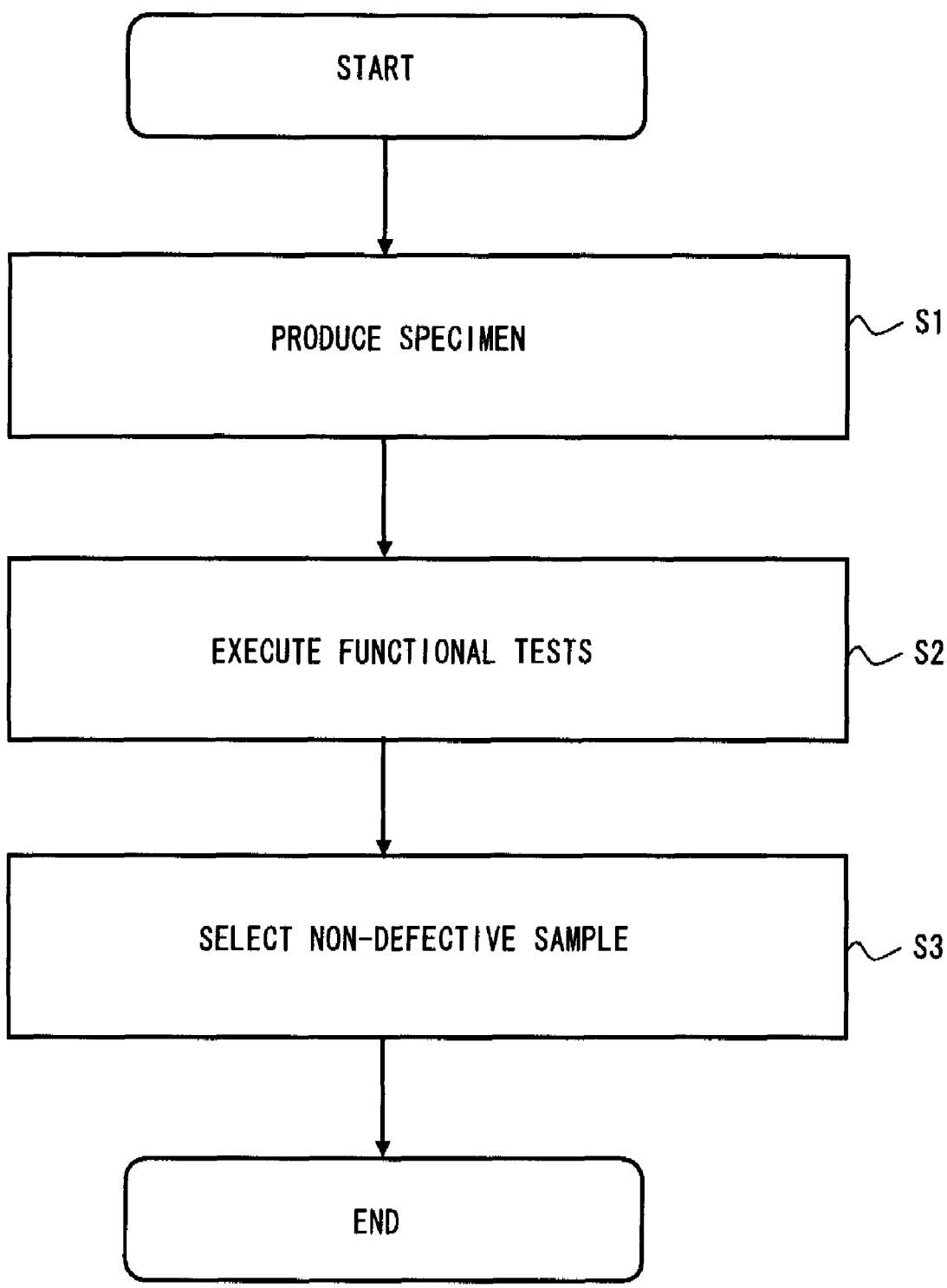
FIG. 5 is a schematic flowchart for explaining a process for selecting a non-defective sample according to the first embodiment of the present invention.
Figure 6:
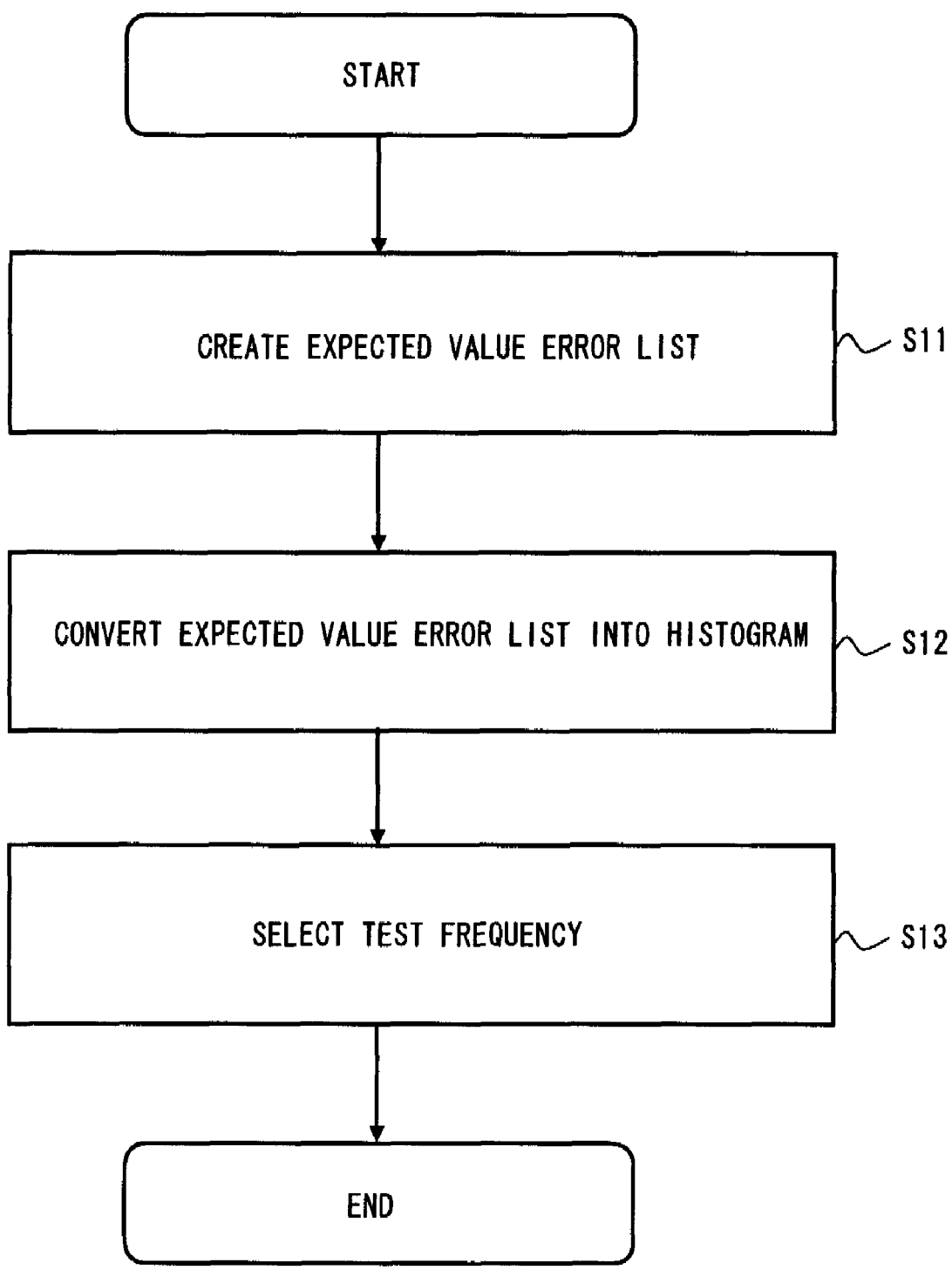
FIG. 6 is a schematic flowchart for explaining a process for setting a test frequency according to the first embodiment of the present invention.
Figure 7:
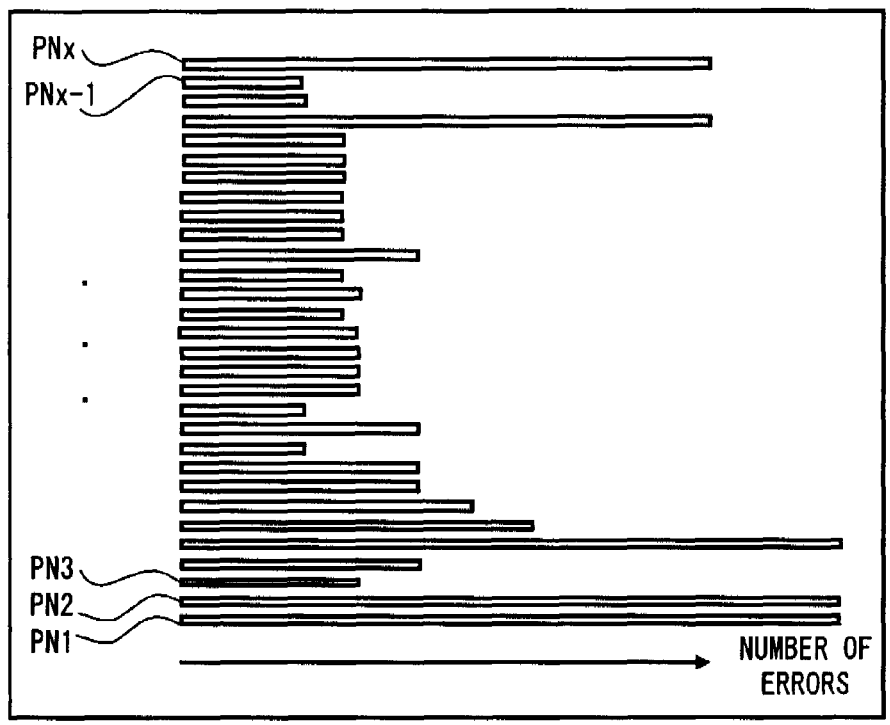
FIG. 7 is a schematic explanatory diagram showing an expected value error list according to the first embodiment of the present invention.
Figure 8:
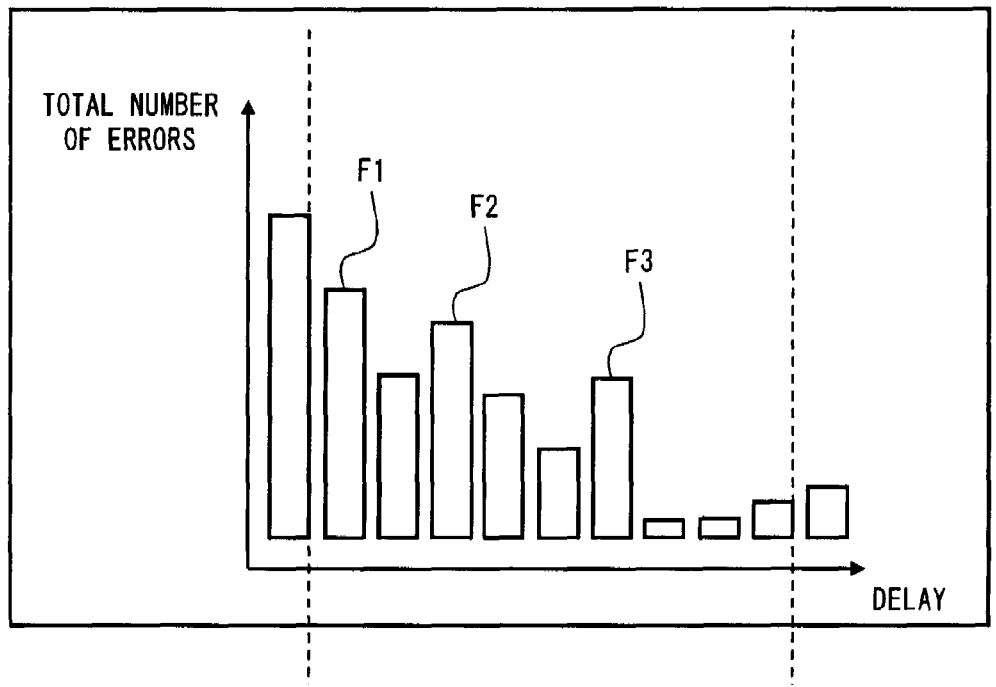
FIG. 8 is a schematic explanatory diagram showing an expected value error histogram according to the first embodiment of the present invention.
Figure 9:
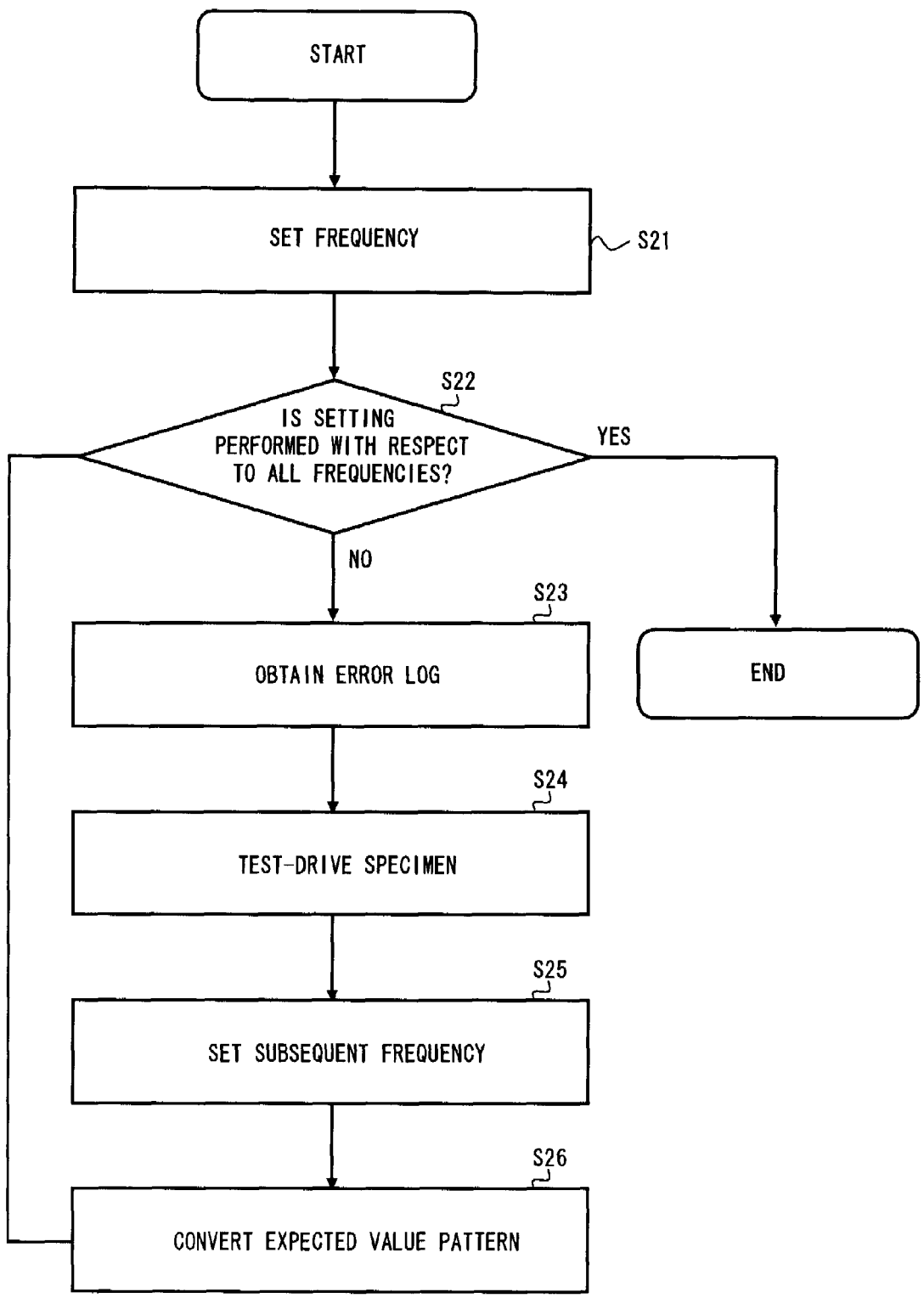
FIG. 9 is a schematic flowchart for explaining a process for converting an expected value pattern according to the first embodiment of the present invention.
Figure 11:
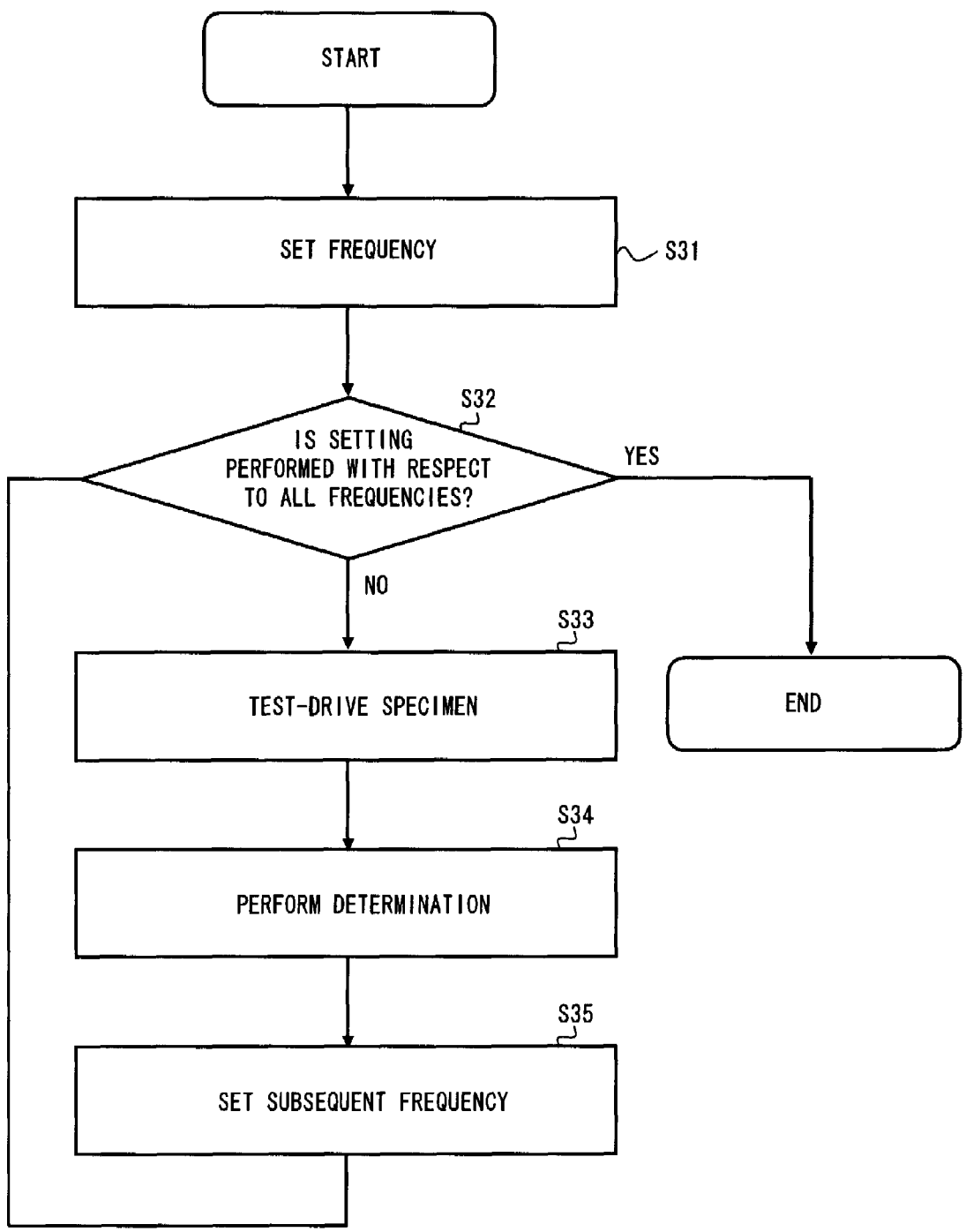
FIG. 11 is a schematic flowchart for explaining operations of a determination unit according to the first embodiment of the present invention.

A first embodiment of the present invention will be described with reference to FIGS. 1 to 11. FIG. 1 is a schematic block diagram showing an automatic test apparatus. FIG. 2 is a diagram for explaining a delay test. FIG. 3 is a diagram for explaining a clock signal for a delay test input to a specimen. FIGS. 4A and 4B are diagrams for explaining a delay value. FIG. 5 is a schematic flowchart for explaining a process for selecting a non-defective sample. FIG. 6 is a schematic flowchart for explaining a process for setting a test frequency. FIG. 7 is a schematic explanatory diagram showing an expected value error list. FIG. 8 is a schematic explanatory diagram showing an expected value error histogram. FIG. 9 is a schematic flowchart for explaining a process for converting an expected value pattern. FIG. 10 is a schematic diagram for explaining conversion of the expected value pattern. FIG. 11 is a schematic flowchart for explaining operations of a determination unit.

As shown in FIG. 1, a specimen 20 is connected to an automatic test apparatus (test apparatus) 50. The automatic test apparatus 50 tests the specimen 20 and determines the specimen 20 as a non-defective product or a defective product. The specimen 20 is a semiconductor integrated circuit having clock terminals, input terminals, and output terminals. The input terminals and the output terminals each include n (n is a natural number equal to or greater than two) number of terminals.

As schematically shown in FIG. 2, the automatic test apparatus 50 performs a delay test. The automatic test apparatus 50 transfers a value, which is set to a flip-flop (F/F) 15, from the F/F 15 to an F/F 19 by a clock having two pulses shown in FIG. 3. Specifically, a hold value of the F/F 15 is transferred to an F/F 17 by a pulse PS1 shown in FIG. 3, and a hold value of the F/F 17 is transferred to the F/F 19 by a pulse PS2 shown in FIG. 3.

A time delay at a rise time t2 of the pulse PS2 with respect to a rise time t1 of the pulse PS1 as shown in FIG. 3 is referred to as a delay value. The delay value is set in consideration of a propagation delay caused in a path set to the specimen 20.

In the first embodiment of the present invention, as shown in FIG. 4A, assuming that the propagation delay caused in a normal path is 6 ns, the delay value can be set to, for example, 8 ns. Note that, as shown in FIG. 4B, it is assumed that the delay value set so as to correspond to a normal operating frequency of the specimen 20 is 10 ns. The delay value is set to a small value as shown in FIG. 4A, thereby making it possible to detect the propagation delay of a signal caused in the specimen 20 with higher precision. The reason why the test can be satisfactorily performed even when the delay value is set to a small value becomes clear from the following description. Note that the delay value and the frequency of the clock are values closely related to each other. When the delay value is 10 ns, the frequency is 100 MHz.

As shown in FIG. 1, the automatic test apparatus 50 includes a control unit 1, a test pattern storing unit 2, an expected value pattern storing unit 3, a test frequency setting unit 4, a pattern converting unit 5, a converted expected value pattern storing unit 6, a determination unit 7, and a mode control unit 8. The automatic test apparatus 50 further includes a clock terminal P1, a data terminal P2, and a data terminal P3. It is assumed that the data terminal P2 includes n number of terminals corresponding to the number of the input terminals of the specimen 20. The data terminal P3 also includes n number of terminals corresponding to the number of output terminals of the specimen 20. The test frequency setting unit 4 includes an error list generating unit 9, a histogram generating unit 10, and a test frequency selecting unit 11. The pattern converting unit 5 includes an error log generating unit 12 and a pattern conversion executing unit 13. Note that, when the function of converting a pattern is focused, the automatic test apparatus 50 serves also as a pattern generator for generating a pattern for determination to be used for a test.

First, a description is given of a connection relation between functional parts of the automatic test apparatus 50. An input "a" of the control unit 1 is connected to the test pattern storing unit 2, and an input "b" of the control unit 1 is connected to the test frequency selecting unit 11. An output "c" of the control unit 1 is connected to the input terminal IN of the specimen 20 through the data terminal P2, and an output "d" of the control unit 1 is connected to the clock terminal CLK of the specimen 20 through the clock terminal P1. The data terminal P3 is connected to the output terminal OUT of the specimen 20, and is also connected to an input "a" of the error list generating unit 9, an input "a" of the error log generating unit 12, and an input "a" of the determination unit 7. Further, an input "b" of the error list generating unit 9 is connected to the expected value pattern storing unit 3. An input "b" of the error log generating unit 12 is connected to the expected value pattern storing unit 3.

An output of the error list generating unit 9 is connected to the histogram generating unit 10. An output of the histogram generating unit 10 is connected to the test frequency selecting unit 11. An output of the test frequency selecting unit 11 is connected to the control unit 1. An output of the error log generating unit 12 is connected to an input "a" of the pattern conversion executing unit 13. An input "b" of the pattern conversion executing unit 13 is connected to the expected value pattern storing unit 3. An output of the pattern conversion executing unit 13 is connected to the converted expected value pattern storing unit 6. The input "a" of the determination unit 7 is connected to the data terminal P3. An input "b" of the determination unit 7 is connected to the converted expected value pattern storing unit 6.

The test pattern storing unit 2 stores the test pattern to be input to the specimen 20 in advance. Similarly, the expected value pattern storing unit 3 stores the expected value pattern to be output from the specimen 20. Note that the test pattern and the expected value pattern are obtained in advance based on circuit information on a semiconductor integrated circuit serving as the specimen 20, as widely known.

The control unit 1 outputs the test pattern obtained from the test pattern storing unit 2. Also, the control unit 1 outputs a clock having a predetermined frequency to be input to the clock terminal of the specimen 20. In the case of actually testing the specimen 20, which is not determined as a non-defective product or a defective product yet, the frequency of the clock output from the control unit 1 is referred to also as a test frequency.

The test frequency setting unit 4 sets the test frequency to be set in the case of testing the specimen 20, which may be a non-defective product or a defective product, by using a non-defective sample. Specifically, the test frequency setting unit 4 checks in advance the extent to which the expected value pattern differs from the output pattern output from the non-defective sample at each frequency, to thereby specify, as the test frequency, the frequency at which a difference between the expected value pattern and the output pattern is large. Thus, it is possible to test the specimen 20 under such conditions that the output pattern output from the specimen 20 greatly differs from the expected value pattern. The frequency set by the test frequency setting unit 4 is equal to or greater than the normal operating frequency of the specimen 20.

Note that the non-defective sample refers to a semiconductor integrated circuit selected as a non-defective sample from among the specimens 20 by the process shown in the flowchart of FIG. 5. Specifically, first, as shown in FIG. 5, the specimen 20 is actually produced (S1). Next, various functional tests (excluding delay test) are executed (S2). Then, based on the results of the functional tests executed in S2, the specimen 20 which shows stable characteristics after a plurality of tests is selected (S3). The specimen 20 thus selected is determined as non-defective also in the delay test with high probability. Note that the specimen 20 is a semiconductor device which is actually produced by the process steps and which actually implements predetermined functions under the influence of process variation, fluctuations in power supply voltage during operation, cross talk during operation, and the like.

As shown in FIG. 1, the test frequency setting unit 4 includes the error list generating unit 9, the histogram generating unit 10, and the test frequency selecting unit 11.

As shown in the flowchart of FIG. 6, the test frequency setting unit 4 specifies the test frequency to be set in the case of testing the specimen 20 which may be a non-defective product or a defective product.

In S11, the error list generating unit 9 creates an expected value error list shown in FIG. 7. It is assumed that a predetermined test pattern and a clock having a predetermined frequency are input to the non-defective sample from the control unit 1. Further, it is assumed that a plurality of clock frequencies are set at predetermined intervals within a range from a limit measurement frequency of the specimen to a frequency of a real speed of the specimen.

Note that the limit measurement frequency refers to a clock frequency set in consideration of only the propagation delay caused in a normal path. In the case of FIG. 4A, the delay value corresponding to the limit measurement frequency is 6 ns. The frequency of the real speed matches the normal operating frequency of the specimen 20 (frequency within a range in which a circuit of a specimen functions satisfactorily). In the case of FIG. 4B, the delay value corresponding to the frequency of the real speed is 10 ns.

The expected value error list shown in FIG. 7 shows the extent to which the output pattern output from a given non-defective sample differs from the corresponding expected value pattern. In other words, when a logical value (binary signal) contained in the expected value pattern is a value different from the corresponding logical value contained in the output pattern, the logical value is counted as an error. Note that a plurality of expected value error lists are generated with the clock frequency as a unit.

To simplify the counting of the number of errors, the number of patterns themselves, each of which contains a logical value determined as an error, may be counted. As apparent from FIG. 7, it is assumed that a plurality of patterns (expected value patterns PN1 to PNx) are prepared for a given frequency.

The histogram generating unit 10 converts the expected value error list into a histogram (S12). The histogram generating unit 10 calculates the total number of errors based on the expected value error lists generated for each frequency, and generates an expected value error histogram shown in FIG. 8. Note that the test frequency specified in this case is set within a range from a limit measurement frequency (th1) to a frequency (th2) of the real speed.

The test frequency selecting unit 11 determines the test frequency to be used in the case of actually testing the specimen 20, which may be a non-defective product or a defective product, based on the expected value error histogram (S13). Specifically, as schematically shown in FIG. 8, between the frequencies th1 and th2, the frequencies F1 to F3 with total number of errors being within the top three are selected as test frequencies. Note that the frequencies selected by the test frequency selecting unit 11 are transferred to the control unit 1.

The pattern converting unit 5 shown in FIG. 1 converts the expected value pattern based on the output pattern output from the non-defective sample, and outputs the expected value pattern obtained after conversion. Note that, in this case, clocks which are set according to the test frequencies F1 to F3 selected by the test frequency setting unit 4 are output from the control unit 1 to the specimen 20.

The pattern converting unit 5 includes the error log generating unit 12 and the pattern conversion executing unit 13. The error log generating unit 12 generates, as an error log, a difference of the expected value pattern from the output pattern output from the non-defective sample. Information stored in the error log is, for example, an identification number of the expected value pattern, and an identification number set to the logical value detected as an error. As a result, in the error log, the difference of the expected value pattern from the output pattern output from the non-defective sample is stored. The pattern conversion executing unit 13 converts the expected value pattern based on the error log generated by the error log generating unit 12. Specifically, the logical value of the expected value pattern specified based on the error log is inverted. The converted expected value pattern output from the pattern conversion executing unit 13 is stored in the converted expected value pattern storing unit 6.

Referring FIG. 9, a description is given of operations of the pattern converting unit 5.

First, the automatic test apparatus 50 sets the frequency of the clock output from the control unit 1, as the test frequency F1 (S21). Next, it is confirmed whether a frequency to be subsequently set is present (S22). In this case, since the test frequencies F2 and F3 are not set, the frequency to be subsequently set is present. Then, the automatic test apparatus 50 test-drives the non-defective sample (S23). Specifically, the control unit 1 sets the test pattern to the non-defective sample, and inputs the clock having the test frequency F1 to the non-defective sample, thereby attempting to execute the delay test. Then, the error log generating unit 12 generates the error log based on the output pattern output from the non-defective sample and based on the expected value pattern (S24). After that, the automatic test apparatus 50 sets the subsequent frequency (S25). In other words, the automatic test apparatus 50 sets the frequency of the clock output from the control unit 1, to the test frequency F2. Then, the pattern conversion executing unit 13 converts the expected value pattern based on the error log(S26). Specifically, the pattern conversion executing unit 13 inverts the logical value of the expected value pattern specified based on the error log. For example, as shown in FIG. 10, a logical value shown at the rightmost end of the plane of FIG. 10 is inverted.

After the pattern conversion, it is confirmed whether the frequency to be subsequently set is present (S22). In this case, the test frequency F3 is present. Accordingly, in the same manner as described above, the steps from S23 to S26 are executed. After that, in S22, the frequency to be subsequently set is not present (S22). Accordingly, the flow for the pattern conversion is finished.

After the automatic test apparatus 50 operates in the manner as described above, the converted expected value pattern storing unit 6 stores the converted expected value pattern corresponding to the test frequency F1, the converted expected value pattern corresponding to the test frequency F2, and the converted expected value pattern corresponding to the test frequency F3.

In this state, the automatic test apparatus 50 is connected to the specimen 20 which is not determined as a non-defective product or a defective product yet. Then, the automatic test apparatus 50 determines the connected specimen 20 as non-defective or defective. Specifically, the determination unit 7 determines whether the output pattern output from the specimen 20 is different from or the same as the converted expected value pattern obtained from the converted expected value pattern storing unit 6. When those patterns match each other, the specimen 20 is determined as non-defective, and when those patterns do not match each other, the specimen 20 is determined as defective.

A description is given of a determination operation executed by the automatic test apparatus 50 with reference to the flowchart of FIG. 11.

First, the automatic test apparatus 50 sets the frequency of the clock output from the control unit 1, as the test frequency F1 (S31). Next, it is confirmed whether the operation of the setting is performed with respect to all the frequencies (S32). In this case, since the test frequencies F2 and F3 are not set, the frequency to be subsequently set is present. Then, the automatic test apparatus 50 test-drives the specimen 20 (S33). Specifically, the control unit 1 sets the test pattern to the non-defective sample, and causes the specimen 20 to input the clock having the test frequency F1. Then, the determination unit 7 determines whether the output pattern output from the specimen 20 is different from or the same as the converted expected value pattern (S34). Note that the converted expected value pattern to be compared with the output pattern in this case corresponds to the test frequency F1. When those patterns match each other, the specimen 20 is determined as non-defective, and when those patterns do not match each other, the specimen 20 is determined as defective. After that, the automatic test apparatus 50 sets the subsequent frequency (S35). In this case, the test frequency F2 is set. Then, in the same manner as described above, the loop of the steps S32 through S35 is executed.

After the execution of the test drive and the determination of the specimen 20 at the test frequency F3, it is determined, in S32, that the test drive and the determination thereof are executed with respect to all the frequencies, whereby the determination operation by the automatic test apparatus 50 is finished.

Note that the mode control unit 8 shown in FIG. 1 activates any one of the test frequency setting unit 4, the pattern converting unit 5, and the determination unit 7. In other words, as apparent from the above description, the mode control unit 8 activates the test frequency setting unit 4 to set the test frequency suitable for the test of the specimen 20. Then, the mode control unit 8 activates the pattern converting unit 5 to convert the expected value pattern based on the output pattern output from the non-defective sample. After that, the mode control unit 8 activates the determination unit 7 to actually test the specimen 20 which is not determined as a non-defective product or a defective product yet.

As apparent from the above description, in the first embodiment of the present invention, the automatic test apparatus 50 utilizes the expected value pattern converted based on the output pattern output from the non-defective sample and tests the specimen 20, which is not determined as a non-defective product or a defective product yet, by using the frequency equal to or greater than the frequency of the real speed.

In the case of using the clock having the frequency within the range equal to or greater than that of the frequency of the real speed, the expected value pattern differs from the output pattern output from the specimen 20 with high probability. However, in this case, as described above, the expected value pattern is converted based on the output pattern output from the non-defective sample, and the converted expected value pattern is used as the pattern for determination. As a result, the pattern for determination is prevented from greatly differing from the output pattern output from the non-defective sample. In addition, the specimen 20 can be tested by using the clock having the frequency equal to or greater than the frequency of the real speed, thereby making it possible to detect the propagation delay of a signal caused in the specimen 20 with high precision.

The technical scope of the present invention is not limited to the above embodiments. The automatic test apparatus 50 may be configured as software, hardware, or a combination thereof. The number of signals contained in a signal sequence of the test pattern, the expected value pattern, or the like may be equal to or greater than two. In other words, "n" of nbit shown in FIG. 1 may be a natural number equal to or greater than two. The determination unit 7 is connected to the converted expected value pattern storing unit 6, and may also be connected to the expected value pattern storing unit 3. Through a switch or the like, the determination unit 7 may be connected to the expected value pattern storing unit 3 or the converted expected value pattern storing unit 6. The number of errors may be counted based on the extent to which the output pattern of the non-defective sample differs from the expected value pattern.

It is apparent that the present invention is not limited to the above embodiments, but may be modified and changed without departing from the scope and spirit of the invention.

What is claimed is:

1. A test apparatus testing a specimen by using a test pattern and an expected value pattern, the test apparatus comprising:
   a control unit to output the test pattern to the specimen;
   a pattern converting unit to convert the expected value pattern based on an output pattern, the output pattern output from the specimen upon an input of the test pattern; and
   a determination unit to determine the specimen as one of a non-defective product and a defective product by using the converted expected value pattern.

2. The test apparatus according to claim 1, wherein the pattern converting unit converts the expected value pattern based on the output pattern output from the specimen selected as the non-defective product based on results of tests other than a delay test.

3. The test apparatus according to claim 1, wherein the pattern converting unit comprises:
an error log generating unit to generate an error log in which a difference between the output pattern and the expected value pattern is stored; and
a pattern conversion executing unit to convert the expected value pattern based on the error log.

4. The test apparatus according to claim 3, wherein the pattern conversion executing unit inverts a logical value of the expected value pattern based on the error log.

5. The test apparatus according to claim 1, wherein the control unit further outputs a clock having a predetermined frequency set based on a comparison between the output pattern and the expected value pattern.

6. The test apparatus according to claim 5, further comprising a test frequency setting unit setting the frequency of the clock output from the control unit,
wherein the test frequency setting unit comprises:
an error list generating unit to generate an error list to associate a number of errors each indicating a difference between the output pattern and the expected value pattern, with the predetermined frequency of the clock;
a histogram generating unit to generate an error histogram indicating a change in the number of errors with respect to a change in the frequency of the clock, based on the error list; and
a test frequency selecting unit selecting the frequency of the clock to be output from the control unit, based on the error histogram.

7. The test apparatus according to claim 6, wherein the frequency of the clock is set by the test frequency setting unit so that the output pattern obtained at the frequency is different from the expected value.

8. The test apparatus according to claim 6, wherein the number of errors each indicating the difference between the output pattern and the expected value pattern is determined based on one of the number of the expected value patterns that are each different from the output pattern, and the number of error logical values included in the expected value patterns that are each different from the output pattern.

9. The test apparatus according to claim 6, wherein:
the error list generating unit generates a plurality of error lists at a plurality of predetermined frequencies at least as high as a normal operating frequency of the specimen; and
the test frequency selecting unit selects the plurality of predetermined frequencies at least as high as the normal operating frequency of the specimen.

10. The test apparatus according to claim 1, wherein the specimen includes a semiconductor integrated circuit.

11. The test apparatus according to claim 1, further comprising:
a test pattern storing unit to store the test pattern; and
an expected value pattern storing unit to store the expected value pattern.

12. A pattern generator generating a pattern for determination to be used for a delay test of a specimen, the pattern generator comprising:
a control unit to output a test pattern to the specimen; and
a pattern converting unit to:
convert an expected value pattern based on an output pattern, the output pattern output from the specimen upon an input of the test pattern, and
to output the converted expected value pattern.

13. The pattern generator according to claim 12, wherein the pattern converting unit converts the expected value pattern based on the output pattern output from the specimen selected as a non-defective product based on results of tests other than a delay test.

14. The pattern generator according to claim 12, wherein the pattern converting unit comprises:
an error log generating unit to generate an error log in which a difference between the output pattern and the expected value pattern is stored; and
a pattern conversion executing unit to convert the expected value pattern based on the error log.

15. The pattern generator according to claim 12, wherein the control unit further outputs a clock having a predetermined frequency set based on a comparison between the output pattern and the expected value pattern.

16. The test pattern generator according to claim 15, further comprising a test frequency setting unit setting the frequency of the clock output from the control unit,
wherein the test frequency setting unit comprises:
an error list generating unit to generate an error list to associate a number of errors each indicating a difference between the output pattern and the expected value pattern, with the predetermined frequency of the clock;
a histogram generating unit to generate an error histogram indicating a change in the number of errors with respect to a change in the frequency of the clock, based on the error list; and
a test frequency selecting unit to select the frequency of the clock to be output from the control unit, based on the error histogram.

17. The pattern generator according to claim 16, wherein the frequency of the clock set by the test frequency setting unit matches a frequency at which the output pattern and the expected value pattern are different from each other.

18. A test method of testing a specimen by using a test pattern and an expected value pattern, the test method comprising:
inputting the test pattern to the specimen;
converting the expected value based on an output pattern, the output pattern output from the specimen upon an input of the test pattern; and
determining the specimen as one of a non-defective product and a defective product by using the converted expected value pattern.

19. The test method according to claim 18, wherein the expected value pattern is converted based on the output pattern output from the specimen selected as the non-defective product based on results of tests other than a delay test.

20. A pattern generating method of generating a pattern for determination to be used for a delay test of a specimen, the pattern generation method comprising:
inputting a test pattern to the specimen; and
converting an expected value pattern based on an output pattern, the output pattern output from the specimen upon an input of the test pattern.

* * * * *